United States Patent
Mito et al.

(10) Patent No.: US 7,541,805 B2
(45) Date of Patent: Jun. 2, 2009

(54) MAGNETIC CHARACTERISTICS MEASURING METHOD AND SYSTEM

(75) Inventors: Masaki Mito, Kitakyushu (JP); Kunihiko Irie, Kobe (JP); Junpei Yamada, Kitakyushu (JP); Seishi Takagi, Kitakyushu (JP); Hiroyuki Deguchi, Kitakyushu (JP)

(73) Assignee: Kyushu Institute of Technology, Fukuoka (JP)

( * ) Notice: Subject to any disclaimer, the term of this patent is extended or adjusted under 35 U.S.C. 154(b) by 124 days.

(21) Appl. No.: 11/693,476

(22) Filed: Mar. 29, 2007

(65) Prior Publication Data

US 2008/0074110 A1  Mar. 27, 2008

(30) Foreign Application Priority Data

Sep. 26, 2006 (JP) ............................. 2006-259977

(51) Int. Cl.
*G01R 33/035* (2006.01)
*G01N 27/72* (2006.01)

(52) U.S. Cl. ...................................... 324/248; 324/229

(58) Field of Classification Search ................ 324/248, 324/249, 244, 228, 239; 600/409; 326/5; 505/162, 845, 846; 327/366, 367, 370, 527, 327/528
See application file for complete search history.

(56) References Cited

U.S. PATENT DOCUMENTS 5,963,160 A * 10/1999 Wilson et al. ............... 341/143
7,202,661 B2 * 4/2007 Keene et al. ................ 324/239
2007/0210790 A1 * 9/2007 Butters et al. ............... 324/248

FOREIGN PATENT DOCUMENTS

JP  2004-028955  1/2004

OTHER PUBLICATIONS

A. D. Hibbs, R. E. Sager, S. Kumar, J. E. McArthur, and A. L. Singsaas; A Squid-based ac susceptometer; Ref. Sci. Instrum. 65 (1994) pp. 2644-2652, Aug. 1994.
Masaki Mito, Kunihiko Irie, Junpei Yamada, Seishi Takagi, Hiroyuki Deguchi, and M. Ihizuka; Development of magnetic measurement system under high pressure using Squid II; Meeting Abstracts of the Physical Society of Japan, Publishing No. 27PSB-56 (p. 463); Mar. 27-30, 2006.

* cited by examiner

*Primary Examiner*—Kenneth J Whittington
(74) *Attorney, Agent, or Firm*—McGlew and Tuttle, P.C.

(57) ABSTRACT

A magnetic characteristics measurement system includes a superconducting quantum interference device which detects a magnetization of a sample located in the vicinity of a superconducting pickup coil and outputs an electrical signal representing the magnetization. A coil is disposed to surround the superconducting pickup coil and is connected to an AC power supply so as to generate an alternating magnetic field. The AC signal output from the superconducting quantum interference device is sampled by use of an A/D converter which is operable in an audio frequency range and outputs a digital signal corresponding to the AC signal. Phase adjustment is performed so as to optimally correct a time shift of the digital signal in relation to a reference voltage signal. The phase-adjusted signal is subjected to Fourier transformation processing so as to detect harmonic components as magnetic characteristics.

9 Claims, 9 Drawing Sheets (UPPER; Ref = 0.05Vrms, LOWER; Ref = 2Vrms  f = 460Hz)

MAGNETIC CHARACTERISTICS MEASURING METHOD AND SYSTEM

BACKGROUND OF THE INVENTION

1. Field of the Invention

The present invention relates to a magnetic characteristics measuring method and system, and more particularly to a magnetic characteristics measuring method and system of high accuracy which uses an audio A/D converter and which is combined with a signal-processing technique for extracting a weak magnet signal through fundamental-wave extraction, fast Fourier transformation, and statistical processing (median calculation).

2. Description of the Related Art

Many electronic devices and functional materials, including magnetic recording materials, utilize unique magnetic characteristics. Nowadays, in consideration of environmental and energy concerns, there have been actively developed materials for high speed processing, energy-saving drive, and miniaturization. In a stage where a functional material is actually developed, the processes of "composition" and "evaluation" are repeated again and again. In this regard, an evaluation apparatus having improved performance has been demanded.

A magnetic measurement apparatus of high accuracy which utilizes a superconducting quantum interference device (SQUID) has been known as an apparatus for evaluating magnetic characteristics (see A. D. Hibbs et al., Rev. Sci, Instrum. 65 (1994) pp. 2644-2652). The superconducting quantum interference device, which includes a superconducting ring coupled to one or two Josephson junctions, is suitable for applications such as a high-sensitivity magnetometer, a near magnetic field antenna, and measurement of a very small current or voltage. This magnetic measurement apparatus can perform automatic measurement by means of sequence control under conditions of a wide temperature range (1.7 to 400K) and a strong magnetic field (±7 T).

FIG. 7 is a diagram showing a conventionally known SQUID circuit. As shown in the drawing, the maximum value Ic of current flowing from a DC power supply DC to a dc SQUID changes periodically with an external magnetic flux $\Phi$. Since current is supplied from an AC power supply AC to a feedback coil, the output voltage V of the dc SQUID changes at a period $\Phi_0$. The modulated magnetic flux creates a modulated magnetic field in cooperation with the AC power supply, and tunes the circuit to an optimal low-noise state. A change in magnetic flux detected by a pickup coil (signal coil) is taken out, as an electrical signal, by use of the SQUID, which functions as a transformer. The change in magnetic flux detected by the pickup coil is reflected as a change in the external magnetic flux $\Phi$. The principle of the fluxmeter is such that a change in the external magnetic flux is measured in the form of a change in voltage, by use of a portion of a change in the output voltage. This voltage change is output to the outside via a preamplifier and an integrator. A feedback circuit has a function of decreasing a change in the SQUID voltage (caused by a change in magnetic flux) to zero (resets the reference point), to thereby maintain the linearity between change in magnetic flux and change in voltage.

FIGS. 8A to 8C are diagrams showing three different systems using the conventionally known magnetic measurement apparatus. FIG. 8A shows a DC-mode measurement system; FIG. 8B shows a VCM-mode measurement system; and FIG. 8C shows an AC-mode measurement system. In the DC-mode system designed to measure the magnetic flux (DC magnetization) of a sample, the sample is placed in a superconducting coil for detection, the magnetic flux of the sample is measured, and a signal indicative of the measured magnetic flux is output via a SQUID probe. This system has a drawback of being weak against noise. In the VCM (vibrating coil magnetometer)-mode system, the DC magnetic susceptibility is measured through detection of the amplitude of the AC SQUID voltage at the time when the superconducting coil for detection is vibrated by means of an actuator and a piezoelectric element. This system has drawbacks in that the resonance condition of the piezoelectric element changes with temperature, maintaining a consistent vibration condition is difficult, and the output signal includes noise stemming from mechanical vibration. In the AC-mode system, a sample is placed in an alternating magnetic field generated by an AC coil, and the AC magnetic susceptibility is measured through detection of the AC signal amplitude of the SQUID voltage. As will be described later, the present invention enables magnetic measurement to be performed by use of a SQUID even in a situation where the magnetic shield is incomplete, through an improvement on the above-described AC-mode measurement system; in particular, an improvement on the signal processing technique for an electric signal from a SQUID controller.

FIG. 9 is a block diagram showing a conventionally known food inspection apparatus to which the above-described magnetic measurement apparatus is applied (see Japanese Patent Application Laid-Open (kokai) No. 2004-28955). In the illustrated food inspection apparatus, a coil is provided to surround a cryogenic insulating container in which a SQUID magnetic sensor is accommodated. The cryogenic insulating container and the coil are covered with a permalloy magnetic shield so as to shield them against external magnetic noise. A belt conveyer conveys a food (measurement sample) through an opening of the magnetic shield to a region inside the coil and just under the SQUID magnetic sensor.

The coil is connected to an AC oscillator, and generates an alternating magnetic field. The output of the SQUID magnetic sensor is fed via a sensor controller to a lock-in amplifier, at which the output undergoes phase detection and amplification, and is then output to a recorder. The signal from the sensor controller itself is also fed to the recorder via a filter, at which high-frequency components are removed from the signal. Thus, the output of the lock-in amplifier and the output of the filter are recorded. Further, the output of the lock-in amplifier and the output of the filter are also fed to a personal computer, which determines whether or not the food product contains a feebly-magnetic foreign substance. The signal output from the AC oscillator is also used as a reference voltage signal for the lock-in amplifier.

The lock-in amplifier has a function of selectively detecting a signal synchronized with the applied alternating magnetic field. For example, when an alternating magnetic field of 100 Hz is applied, among the components output from the SQUID magnetic sensor, only a signal component in a very narrow band around 100 Hz can be extracted (see "Example" to be described later).

Although apparatuses using such a lock-in amplifier have been used for more 10 years since the start of their global spread, their measurement accuracy has not been improved. In the case of such a conventional apparatus, improving measurement accuracy is difficult unless a sample to be measured produces a large signal or measurement is performed within a magnetic shield. Further, since the conventional apparatus using a lock-in amplifier is not designed to visually monitor the electronic signal in real time, it is difficult to cope with problems such as a large time delay of the detection signal in relation to the reference voltage signal, which occurs due to eddy current, and harmonic analysis cannot be performed easily.

Software of the conventional SQUID magnetic measurement apparatus is not designed with the assumption that a pressure-generation device formed of a metal is inserted into the apparatus. In actuality, in order to correct for an influence of eddy current flowing within a metallic component necessarily placed in the apparatus, basic data for phase adjustment are previously obtained by use of a standard sample (stored in a hard disk drive within a PC), and the data are used as a basis for correcting for the influence of the eddy current. However, when a metallic pressure cell having a large capacity is inserted into the apparatus for the purpose of, for example, a pressure experiment, the above-mentioned basic data become meaningless. The influence of eddy current generated upon use of a metallic cell is remarkable, and the phase shift reaches 90 degrees at 1 kHz, which indicates that proper measures for phase adjustment must be taken.

AC magnetic susceptibility can be decomposed into a component which follows an alternating magnetic field and a component which has a 90-degree phase shift and which represents energy loss. In general, such decomposition is performed by means of complex Fourier transformation; the former is called a "real component," and the latter is called an "imaginary component." For actual evaluation of magnetic characteristics, in many cases, evaluation of the real component is sufficient; however, in the case where more detailed physical information is required, attention must be paid to the imaginary component. The imaginary component reflects energy loss, and in the case where the magnitude of a magnetic moment attenuates with time, the size of an energy barrier which causes such a phenomenon (which serves as an index of stability in term of realization of a metastable electronic state) can be estimated from the frequency dependency of the peak position of the imaginary component. Further, since the imaginary component does not include a paramagnetic signal attributable to magnetic ions of an impurity, use of the imaginary component is effective for evaluation of the magnetic transition temperature of a magnetic material of low purity. As described above, the imaginary component becomes an important physical quantity when a magnetic relaxation phenomenon (essential for studies on nano-size magnetic materials) is examined thoroughly or when the magnetic transition temperature of a subject substance is evaluated.

Moreover, since the conventional SQUID magnetic measurement apparatus is designed with importance placed on DC measurement, the apparatus does not enable use of a SQUID in a high-frequency alternating magnetic field. Heretofore, apparatuses using a SQUID can measure AC magnetic susceptibility up to about 1.5 kHz. When a relaxation phenomenon of a magnetic behavior is studied on the basis of AC magnetic susceptibility, the wider the frequency range of an alternating magnetic field (the importance of AC magnetic susceptibility increases stepwise with every order of magnitude of frequency-range expansion), the more clear the mechanism of expressing the magnetic behavior. However, the upper limit of the frequency range of the above-mentioned apparatus is 1 kHz, and studies have not yet been performed on high accuracy measurement of the magnetic behavior in a high frequency band. The apparatuses which do not use a SQUID (for example, those which utilize simple mutual induction) are insufficient in terms of accuracy, although they can perform measurement up to 10 kHz. As described above, expansion of the frequency range is scientifically important, because of its potential value, even if the expansion is only one order of magnitude.

SUMMARY OF THE INVENTION

An object of the present invention is to solve the above-mentioned problems and to establish technical elements for acquiring a voltage signal from a SQUID probe and analyzing the signal, to thereby improve the accuracy of a magnetic characteristics measurement system (measurement of AC magnetic susceptibility) and expand its use for measurement.

When a sample to be measured is placed in an alternating magnetic field, the SQUID outputs an AC signal. This AC signal is sampled by use of an A/D converter (for audio use) having high noise resistance, and a resultant digital signal is fed to a personal computer. In the personal computer, various signal processing techniques (e.g., oversampling, fundamental-wave extraction, fast Fourier transformation, statistical processing) are applied to the digital signal so as to accurately detect a weak signal of interest. This technique replaces an operation which has conventionally been performed by use of a commercially available lock-in amplifier, and can flexibly cope with correction of eddy current and detection of higher-order harmonic magnetic susceptibility.

Moreover, another object of the present invention is to expand the frequency range while maintaining measurement accuracy. In the case of measurement of AC magnetic susceptibility, which is performed so as to observe a magnetic relaxation phenomenon, the wider the frequency band of an alternating magnetic field, the greater the value of the experiment.

A magnetic characteristics measuring method and system according to the present invention uses a superconducting quantum interference device which detects a magnetization of a sample to be measured located in the vicinity of a superconducting pickup coil and outputs an electrical signal representing the magnetization; and a coil connected to an AC power supply so as to generate an alternating magnetic field around the superconducting pickup coil, wherein the magnetic characteristics of the sample are measured by use of the superconducting quantum interference device. The AC signal output from the superconducting quantum interference device is sampled by use of an A/D converter which is operable in an audio frequency range and outputs a digital signal corresponding to the AC signal. Phase adjustment is performed so as to optimally correct a time shift of the digital signal in relation to a reference voltage signal. The phase-adjusted signal is subjected to Fourier transformation processing so as to detect harmonic components as magnetic characteristics.

Moreover, in the magnetic characteristics measuring method and system according to the present invention, fundamental-wave extraction processing is performed for the digital signal output from the A/D converter in a plurality of stages so as to successively extract each of the harmonic components as a fundamental wave signal; the phase of the fundamental wave signal is adjusted such that the fundamental wave signal has the same phase as a corresponding reference signal having the same frequency as the fundamental wave signal. The phase-adjusted fundamental wave signal is multiplied by the corresponding reference signal, and a component representing the product between the phase-adjusted fundamental wave signal and the corresponding reference signal is extracted. The extracted component is subjected to Fourier transformation processing so as to extract the corresponding harmonic component as magnetic characteristics, while separating the harmonic component from a noise component.

The A/D converter for audio use serves as a digital signal recorder in which, after filtering by use of an analog filter, oversampling A/D conversion is performed, and then filtering is performed by use of a digital filter so as to eliminate quantization noise. The A/D converter for audio use is effective in an audio frequency of 20 Hz to 20 kHz. Preferably, the A/D converter is an A/D converter of a large bit number, high sampling rate type, which samples a signal at a sampling rate of at least 40 kHz, and quantizes the value of the signal to a digital value of at least 16 bits.

According to the present invention, through use of a superconducting quantum interference device, a weak magnetic signal can be detected in a wide frequency range with high accuracy, which has not conventionally been achieved. In particular, the measurement apparatus is configured to be a visual type (open type) in which a user can check, on a display of a personal computer, signal extraction and analysis operation, which are apt to be placed in a black box, and various types of signal processing and statistical processing are performed there. Thus, it becomes possible to detect a magnetic signal which cannot be detected by a conventional apparatus due to noise. That is, a considerably complicated work, which has theoretically been possible to perform by use of an oscilloscope and a lock-in amplifier in the past, can be readily and accurately performed on the screen of the personal computer within a short period of time.

Further, according to the present invention, an importance is placed on the statistical mean (median), whereby the functionality of an apparatus using a SQUID, which is weak against noise, can be drawn out to the greatest extent, and the measurement frequency range can be greatly expanded. The measurement frequency range has been expanded up to a frequency above 20 kHz (the highest frequency 1.5 kHz in the case of a conventional apparatus using a SQUID, and 10 kHz even in the case of an apparatus not using a SQUID).

Results of experiments performed so far show that a measurement accuracy of $10^{-9}$ to $10^{-11}$ emu can be achieved under the conditions that a sample is placed at the center of a pickup coil; about 200 signal waves are sampled in one measurement; fundamental-wave extraction and fast Fourier transformation are performed so as to estimate the rms value; the measurement of the same conditions is repeated 250 times; and the median of these rms values is calculated, wherein the magnitude of the alternating magnetic field is 5.40 e, the frequency of the alternating magnetic field is 40 to 100 Hz, and a superconducting magnet is provided for enhancing magnetic shielding (the conventional apparatus has an accuracy of about $10^{-7}$ emu in the AC mode and about $10^{-8}$ emu mode in the DC mode).

According to the present invention, harmonic components can be readily detected (some conventional AC-magnetic-susceptibility measurement apparatuses which do not use a SQUID can detect harmonic components; however, their accuracies are far below the accuracy of the apparatus of the present invention (about $1/10,000$ to $1/100,000$ that of the apparatus of the present invention)).

DETAILED DESCRIPTION OF THE PREFERRED EMBODIMENTS

Figure 1:
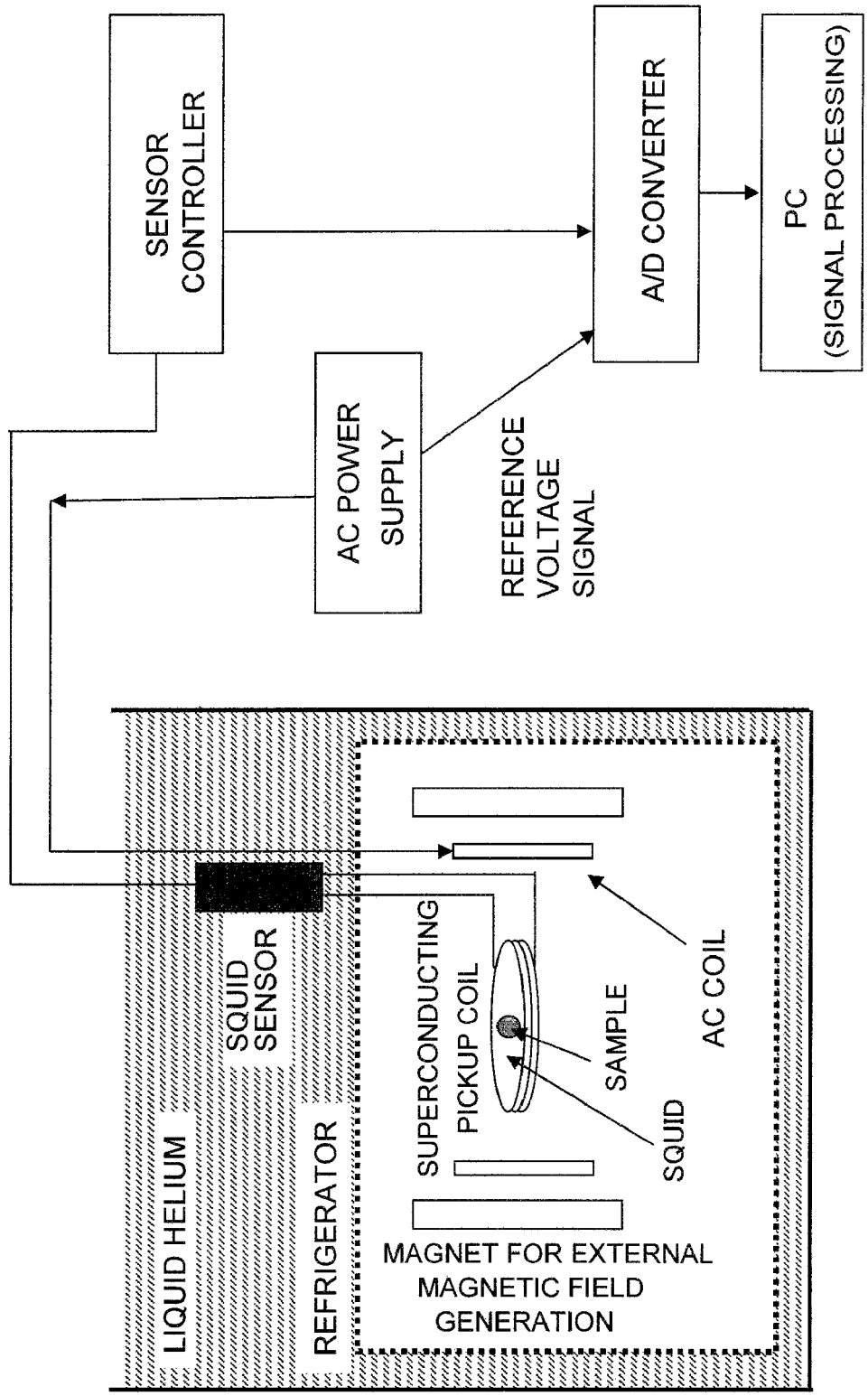
FIG. 1 is a diagram showing the entirety of a magnetic characteristics measuring system of the present invention which utilizes a SQUID.
Figure 7:
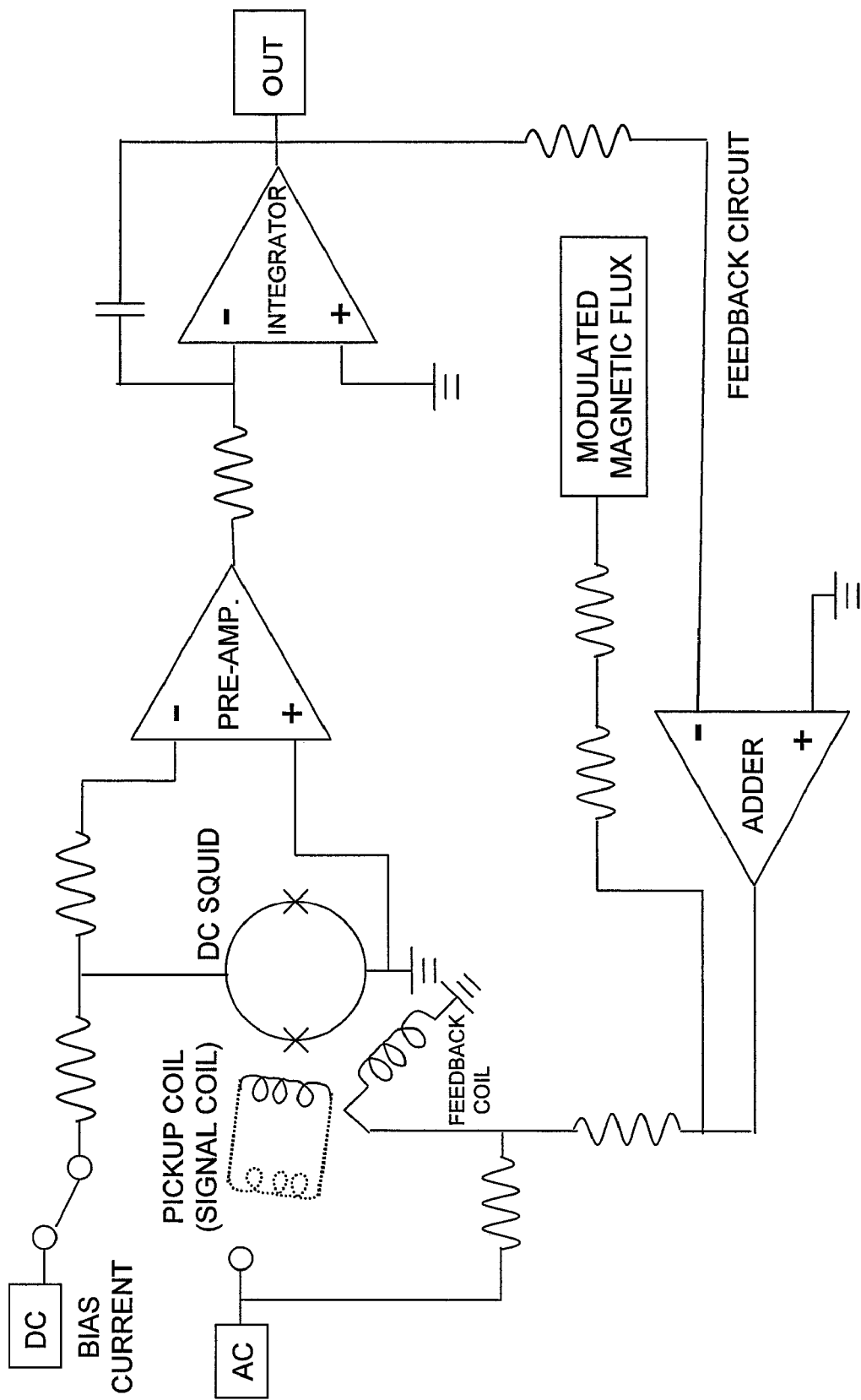
FIG. 7 is a diagram showing the configuration of a conventionally known SQUID circuit.

The present invention will now be described by way of examples. FIG. 1 is a diagram showing the entirety of a magnetic characteristics measuring system of the present invention which utilizes a SQUID (superconducting quantum interference device). A SQUID sensor, a sensor controller, and an AC power supply shown in FIG. 1 form a circuit corresponding to the conventionally known SQUID circuit as shown in FIG. 7. In the magnetic characteristics measurement system of the present invention, the sensor controller and the AC power supply are connected to an A/D converter having an oversampling function, and the output of the A/D converter is connected to a personal computer for signal processing.

A change in magnetic flux detected by means of a superconducting pickup coil is detected by a SQUID, which functions as a transformer. An AC coil for generating an alternating magnetic field is provided around the superconducting pickup coil, and a magnet for generation of an external magnetic field is provided to surround the AC coil. This magnet generates a stable magnetic field, and provides a magnetic shield. This magnet enhances the function of the magnetic shield so as to reduce the influence of magnetic noise by hardware in a very stable static magnetic field. A sample whose magnetization is to be measured is placed in the vicinity of the superconducting pickup coil. The superconducting pickup coil, the SQUID, and the external magnetic field generation magnet are cooled to a superconducting temperature by means of a refrigerator.

Figure 8:
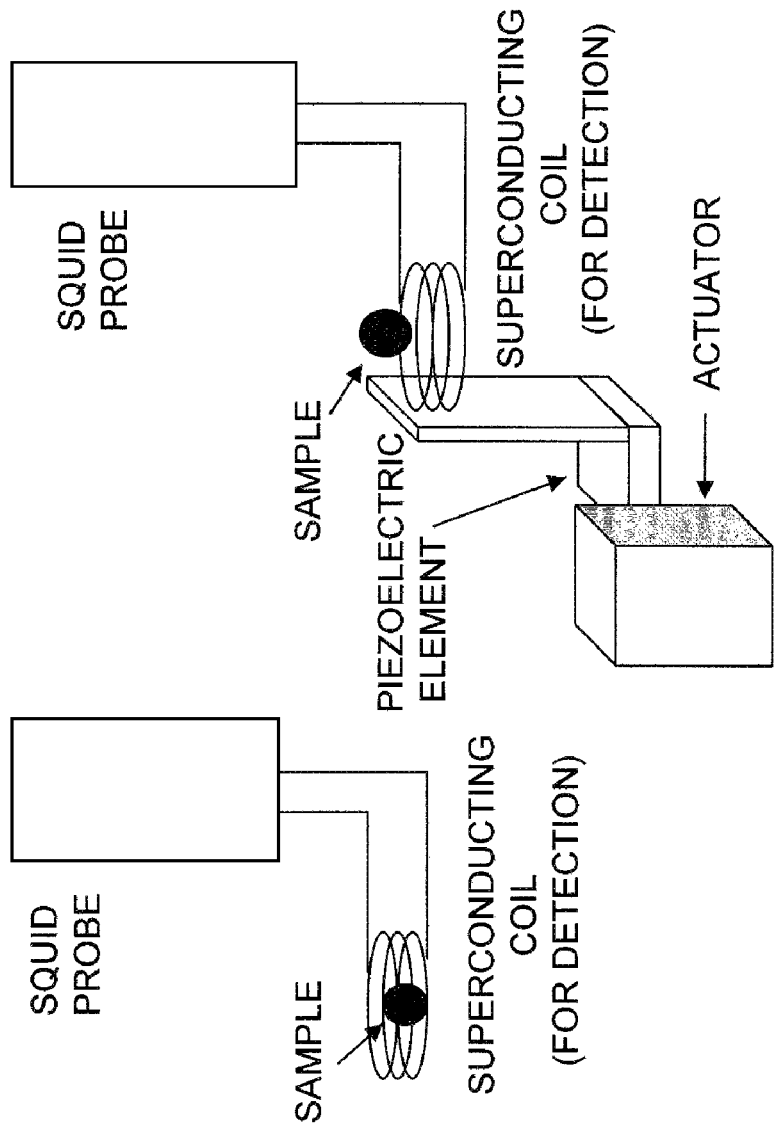
FIGS. 8A to 8C are views showing three different system using a conventionally known magnetic measurement apparatus.
Figure 9:
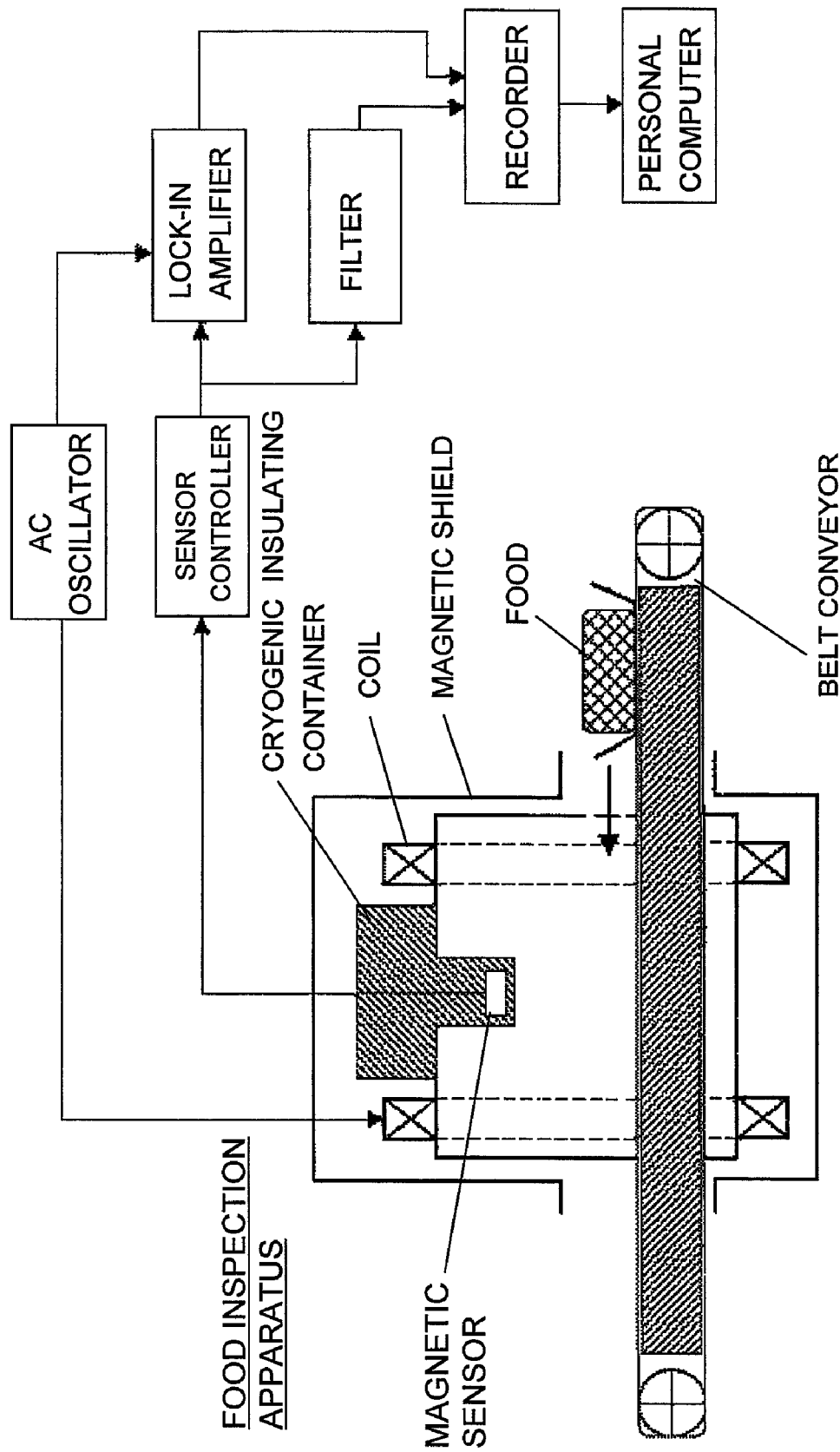
FIG. 9 is a diagram showing a conventional food inspection apparatus to which the magnetic measurement apparatus is applied.

The AC coil for generating an alternating magnetic field is a solenoid coil formed of copper wire, and is connected to the AC power supply (oscillator) so that the AC coil can generate an alternating magnetic field. A change in magnetic flux at the pickup coil is output via the SQUID sensor and the sensor controller. The sensor controller includes a band-pass filter for filtering, and an amplifier for signal amplification. The above configuration is the same as that of the conventional technique described with reference to FIGS. 7 to 9. In the present invention, the output of the sensor controller and a reference voltage signal from the AC power supply are fed to the A/D converter having an oversampling function, and corresponding digital signals are fed to the personal computer, in which the digital signals undergo signal processing, and the results of analysis at each stage and the final results are displayed.

Since the sample to be measured is placed in an alternating magnetic field, the SQUID sensor outputs an AC signal. This AC signal is sampled by use of an A/D converter (an A/D converter for audio) having high noise resistance, and a digital signal output from the A/D converter is processed for highly accurate detection by use of various signal-processing techniques (e.g., fundamental-wave extraction, fast Fourier transformation, and statistical processing). In addition to the voltage signal from the sensor controller, the reference voltage signal from the AC power supply is input to the A/D converter. The reference voltage signal is used to indicate the magnet field modulation which is realized in a sample space via the AC coil.

Figure 2:
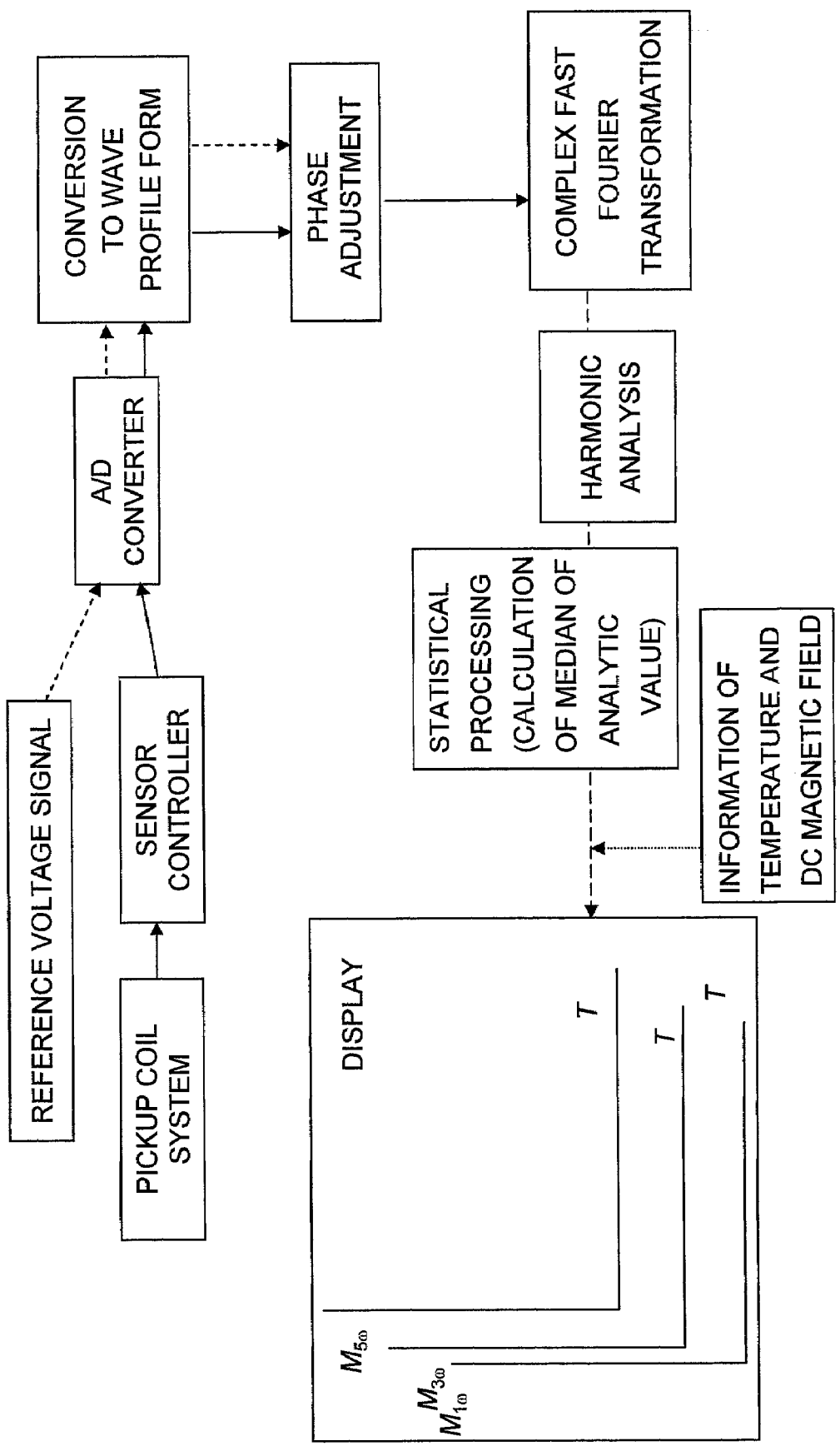
FIG. 2 is a diagram used for explaining signal processing performed in a PC of the magnetic characteristics measuring system shown in FIG. 1, and showing a flow of an electrical signal from a pickup coil.

Next, two system flows (FIG. 2 and FIG. 5) will be described. FIG. 2 is a diagram used for explaining signal processing performed in the PC of the magnetic characteristics measurement system shown in FIG. 1, and showing a flow of an electrical signal from the pickup coil system. As shown in FIG. 2, the output of the pickup coil system is input to the A/D converter, which has a large number of bits and a high sampling rate, via the sensor controller. The digital signal output from the A/D converter is taken into the personal computer, and signal processing is performed thereon. This signal processing is visualized by use of a commercially available software program (LabVIEW). In this signal processing, the digital signal taken into the personal computer is converted to the form of a wave profile, and then phase adjustment, complex fast Fourier transformation, individual detection of the real and imaginary parts of each harmonic component, and statistical processing (median calculation) are performed, and the results of analysis at each stage are displayed on the screen of the personal computer. Further, the final results are displayed on the screen of the personal computer together with information regarding temperature and DC magnetic field. The information regarding temperature displayed on the personal computer enables evaluation of a change in AC magnetic susceptibility with temperature. In addition, when an external DC magnetic field is generated by use of a superconducting magnet, through detection of the intensity of the magnetic field, a magnetic field response at a constant temperature can be tracked.

The A/D converter is preferably an A/D converter for audio use which has high noise resistance. More specifically, the A/D converter is an A/D converter of a large bit number, high sampling rate type, which samples a signal at a sampling rate of at least 40 kHz in an audio frequency range of 20 Hz to 20 kHz, and quantizes the value of the signal to a digital value of at least 16 bits. In this stage, the digital signal output from the A/D converter is converted to the form of a wave profile, which enables visual observation of the digital signal on the screen of the personal computer.

In the phase adjustment, the time shift between the reference voltage signal and the detection signal, both of which have undergone A/D conversion, is optimally corrected. From the results of spectral analysis by use of the complex Fourier transformation at the next stage, the component (in-phase: real part) of each harmonic component which follows the alternating magnetic field and the component (out-of-phase: imaginary part) of each harmonic component which has a 90 degree phase shift and which represents energy loss are detected independently of each other. If the phase shift of the detection signal relative to the reference voltage signal is inappropriately corrected, the real part (in-phase) and the imaginary part (out-of-phase) are incorrectly separated from each other. Therefore, on the basis of calibration data regarding a phase shift obtained by use of a standard sample (in general, a sample with which the imaginary part becomes zero is selected), the in-phase component and the out-of-phase component are optimally separated from each other. Since the calibration data vary among apparatuses, the calibration data are required for each combination of apparatus and environment in which experiments are performed.

In recent years, in addition to temperature and magnetic field, pressure is considered to be an important variable parameter for physical measurement. A pressure generation device designed for insertion into a physical-property measurement apparatus enables measurement under multiple extreme conditions, such as very low temperature, high magnetic field intensity, and high pressure. When AC magnetic susceptibility is measured by such a physical-property measurement with a pressure cell placed therein, a huge amount of eddy current flows, and correction in a stage of signal analysis (a stage before the Fourier transformation) is required, rather than simple correction (addition of a correction value to a calculated value or subtraction of a correction value from the calculated value) after spectral analysis. Although demand for such measurement of AC magnetic susceptibility under high pressure has increased, there has not yet been developed a system which can correct the influence of eddy current in accordance with the specifications of a pressure cell. The analyzing system based on the present invention enables expansion of experiments and research which frequently require such correction of eddy current.

The complex fast Fourier transformation is performed on a signal having undergone phase adjustment in the previous stage. Detection of each harmonic component, and detection of real and imaginary parts thereof are performed simultaneously.

In the harmonic analysis, the rms (root mean square) value of each harmonic component calculated by the complex fast Fourier transformation in the previous stage is individually extracted, and its absolute value in the emu unit system is obtained.

Figure 3A:
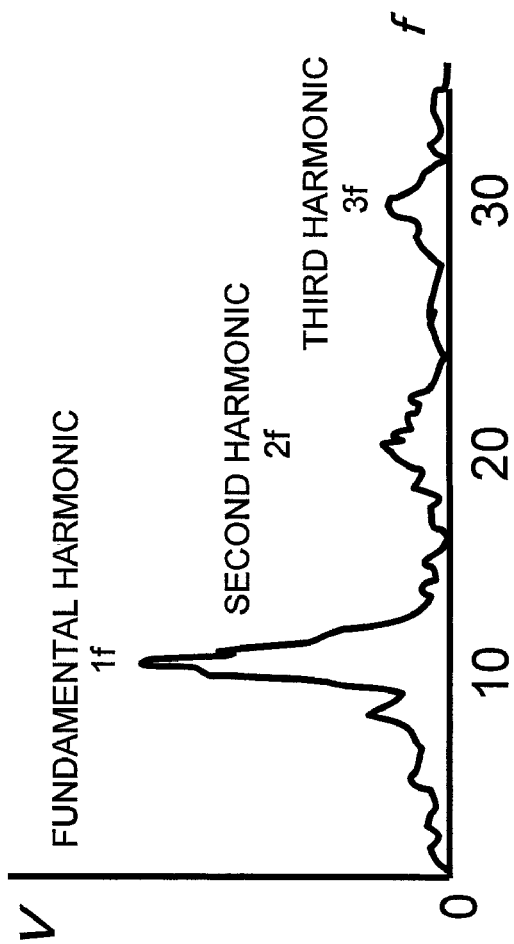
FIGS. 3A and 3B are graphs used for explaining harmonic analysis.
Figure 3B:
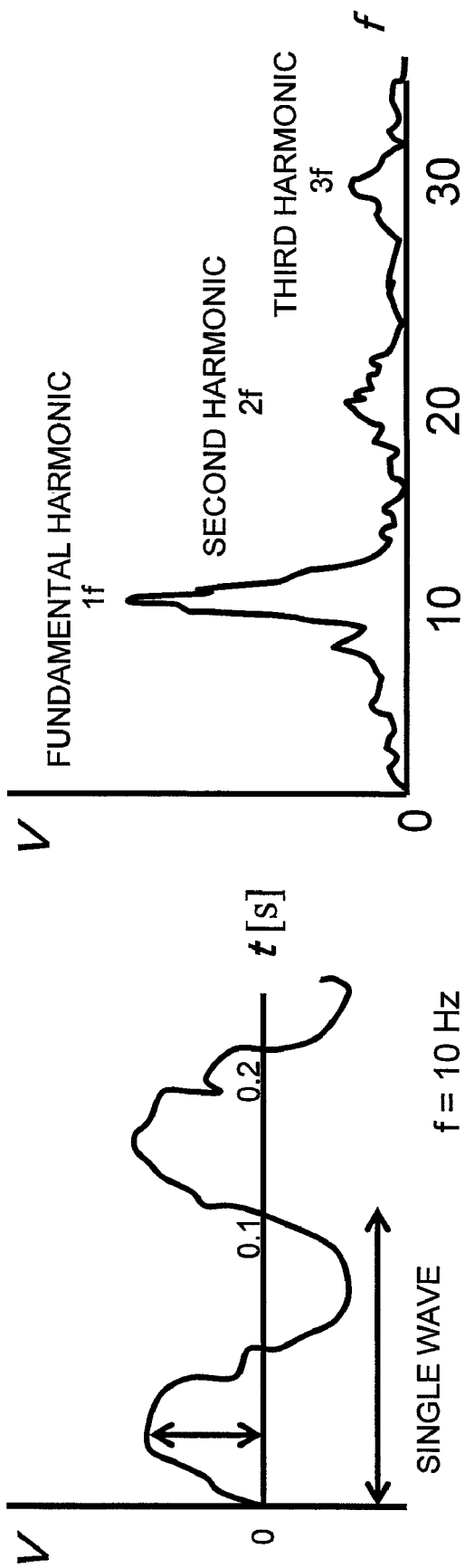

FIGS. 3A and 3B are graphs used for explaining harmonic analysis. In FIG. 3A, one cycle of a detection signal (f=10 Hz) is indicated by an arrow and is labeled "single wave." FIG. 3B shows a fundamental wave (fundamental harmonic) $1f$, a second harmonic $2f$, and a third harmonic $3f$ of the detection signal (f=10 Hz). The horizontal axis of the graph represents frequency (f), and the vertical axis thereof represents the rms value (V) of the AC voltage (of the real part, for example) at each frequency, which is calculated through Fourier transformation. In the course of harmonic analysis, these harmonic signals are individually extracted by use of band-pass filters.

Higher-order harmonic signals, which are essential magnetic data which do not appear due to presence of a magnetic impurity, can specify the nature of a magnetic anomaly, which cannot be specified by the fundamental harmonic alone. Higher-order harmonic signals serve as a very useful probe so as to determine the characteristics of a magnetic material and evaluate a new functionality thereof. No higher-order harmonic appears in the case of a paramagnetic material, and all the higher-order harmonics appear in the case of a ferromagnetic material such as iron. Meanwhile, in the case of a substance exhibiting a glass-like magnetic anomaly, the second harmonic $2f$ does not appear, but the third harmonic $3f$ appears. As described above, the higher-order harmonic components are not influenced by impurities, and serve as an effective probe which can observe the essence of the characteristics of a magnetic material.

In the statistical processing shown in FIG. 2, the rms value of each harmonic component extracted as described above is statistically processed so as to calculate the median value. Since statistical processing is performed on a very weak signal which is only slightly stronger than noise, magnetic measurement using a SQUID can be carried out even when the magnetic shield is incomplete. In the case where a measured value which greatly deviates from the standard value is present, its effect is strongly reflected on the mean value, whereby evaluation of the mean value does not necessarily lead to a desired result, even if the number of sample data is increased. In contrast, in the case of median calculation, an unexpected deviation is not overestimated, and the greater the number N of sample data, the higher the probability with which the optimal value can be detected.

Figure 4A:
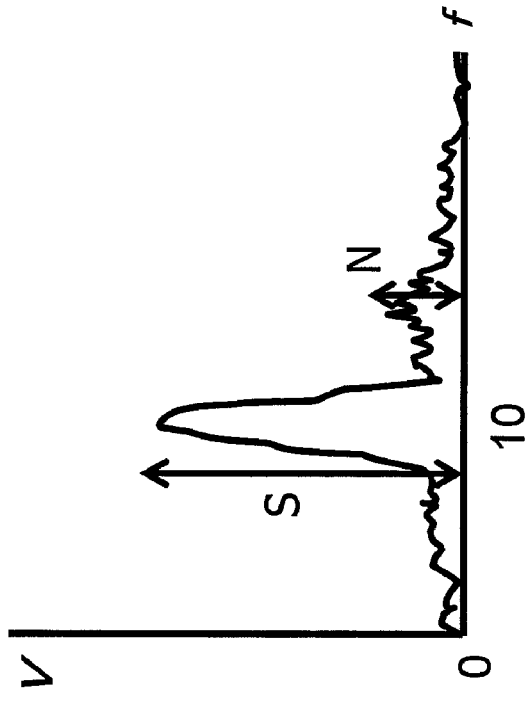
FIGS. 4A to 4D are graphs used for explaining statistical processing.
Figure 4B:
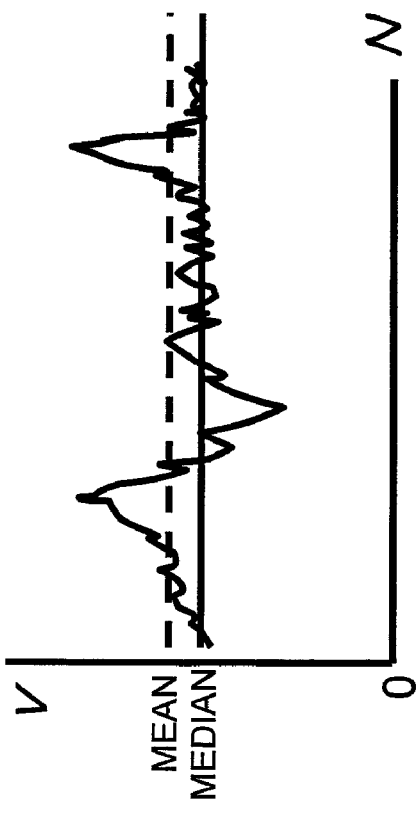
Figure 4C:
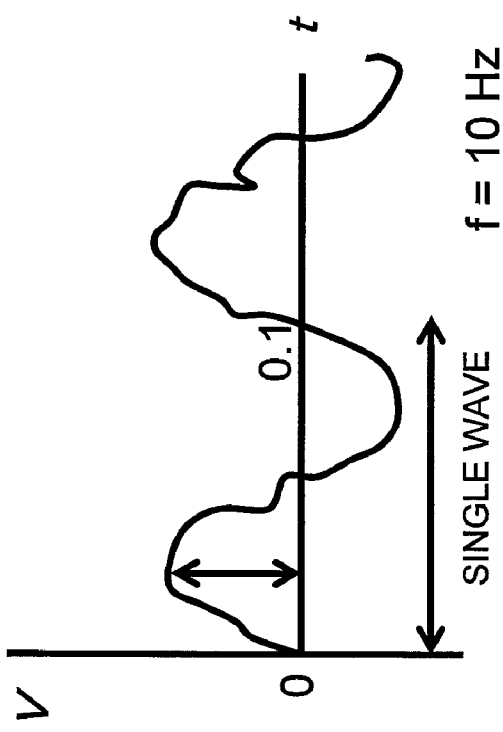
Figure 4D:
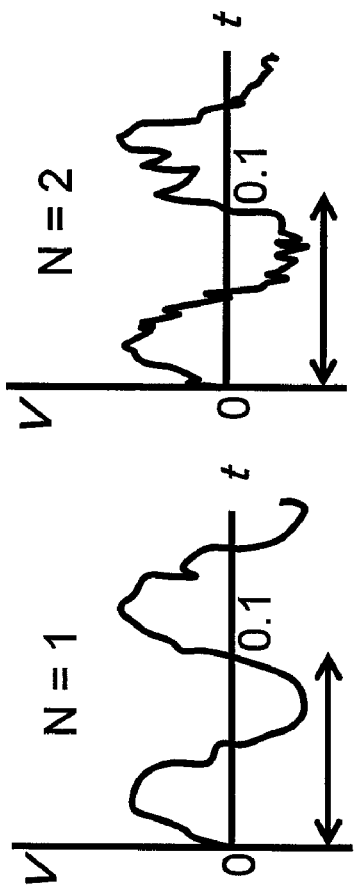

FIGS. 4A to 4D are graphs used for explaining the statistical processing. The statistical processing is performed as follows. Measurement of a plurality of waves (periods) (the number of periods n>20) is performed a plurality of times, and the median of their rms values is calculated (the number of sample data N>200). During measurement under unfavorable conditions, an unexpected noise of a very high level may be mixed in the detection signal. Therefore, the same measurement is performed a plurality of times (typically about 200 times for enhancing the effect of the median calculation), and the median of a lock-in output (specifically, the product of the rms value of the reference signal and the rms value of the detection signal) is calculated, whereby the influence of the mixed noise can be mitigated. In FIG. 4A, one cycle of a detection signal is indicated by an arrow and is labeled "single wave." FIG. 4B shows that when the number of waves (the number of cycles) n is increased, the accuracy (S/N) is improved. FIG. 4C shows an example in which measurement is performed a plurality of times (two times in the illustrated example). FIG. 4D shows, together with the means value, the median obtained as a result of statistical processing performed on the lock-in output after FFT. This processing for statistically obtaining the median is effective for mixing of an unexpected noise, and can draw out the performance of the apparatus to the greatest extent.

As described above, in the signal processing shown in FIG. 2, after the phase of the detection signal with respect to the reference signal is adjusted, only the detection signal is subjected to complex Fourier transformation as is, without being multiplied by the reference signal. In this case, with the complex Fourier transformation, which does not involve extraction of the fundamental wave, higher-order harmonic components can be extracted simultaneously, thereby enabling simultaneous detection of the real and imaginary parts thereof. The phase adjustment is performed on the basis of the standard data. The detection accuracy is $10^{-6}$ to $10^{-7}$ emu, and the effect of fundamental-wave extraction is not exhibited here. Although the system of FIG. 2 is lower in measurement sensitivity than the system of FIG. 5, which will be described later, the operation is simple, and thus, analysis can be completed within a very short period of time. This system can produce satisfactory outcomes for most ordinary measurements.

Figure 5:
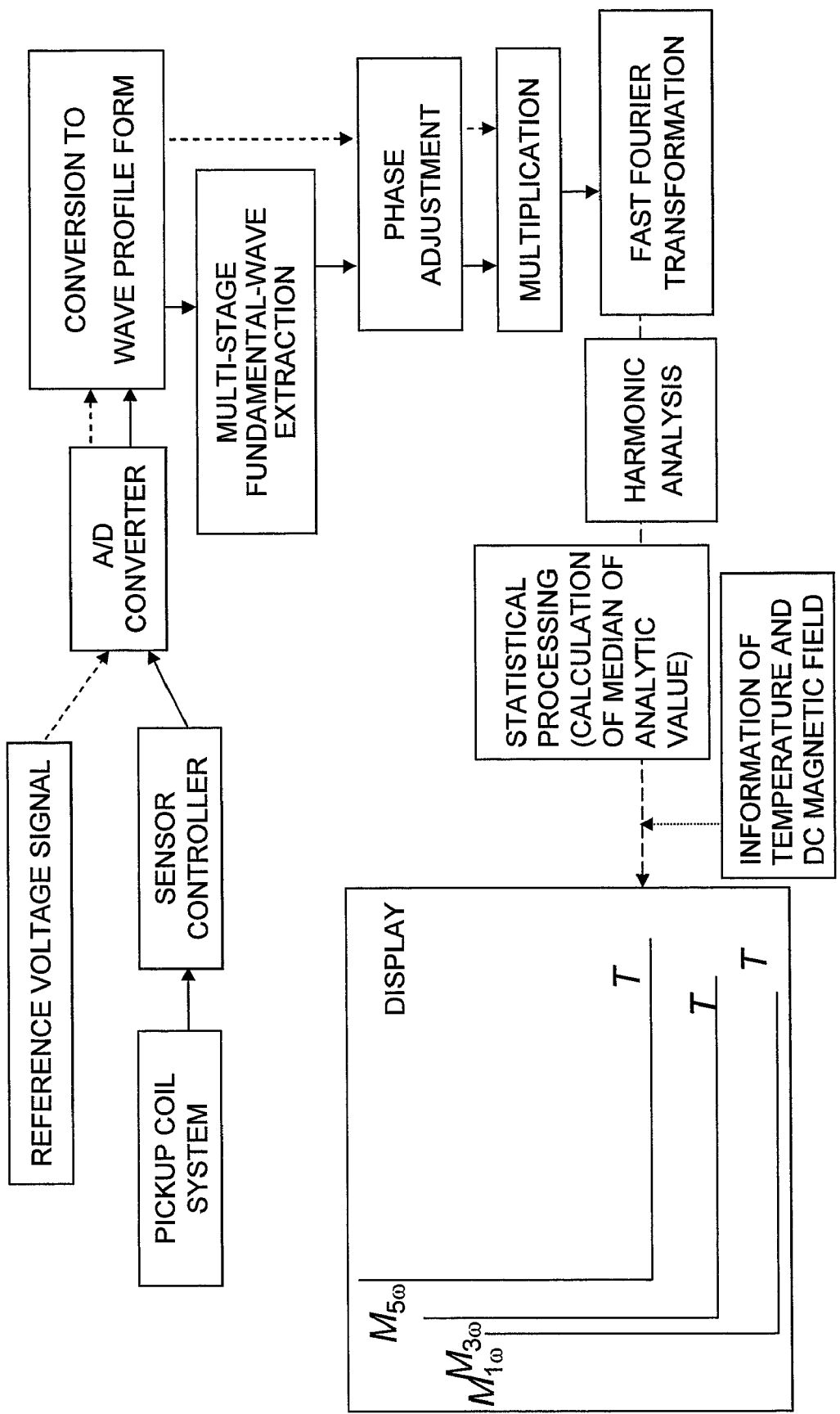
FIG. 5 is a diagram used for explaining signal processing different from that shown in FIG. 2.

FIG. 5 is a diagram used for explaining signal processing different from that shown in FIG. 2. The system of FIG. 5 is employed in the case where the system of FIG. 2 cannot accurately detect even the real component of the fundamental harmonic. As in the case of FIG. 2, the output of the sensor controller and the reference voltage signal from the AC power supply are fed to the A/D converter having an oversampling function, and corresponding digital signals output from the A/D converter are converted to the form of a wave profile, whereby the digital signals can be viewed on the screen of the personal computer.

When the detection signal from the SQUID sensor controller is sufficiently strong, it is possible to optimally correct the time shift of the detection signal in relation to the reference voltage signal and immediately perform complex fast Fourier transformation as shown in FIG. 2. However, when the detection signal is very weak, it is necessary to individually separate and extract intrinsic frequency components by means of (multi-stage) fundamental-wave extraction in a stage preceding the fast Fourier transformation (FFT), as shown in FIG. 5.

The multi-stage fundamental-wave extraction refers to an operation of sequentially extracting waves of major frequencies from an actual signal waveform. In general, the fundamental harmonic component can be extracted from an input signal by means of a first fundamental-wave extraction operation. Next, the first fundamental wave component is subtracted from the input signal, and the resultant signal is subjected to second fundamental-wave extraction. Such an operation is repeated a plurality of times, whereby different harmonics can be successively extracted. When power supply noise becomes greater than the extracted higher-order fundamental wave, the fundamental-wave extraction performed thereafter becomes substantially meaningless. In the system of FIG. 5, the operation of harmonic analysis starts from the operation of successively analyzing and extracting fundamental waves (fundamental harmonic, second harmonic, etc.) at the fundamental-wave extraction in the stage before the fast Fourier transformation (FFT).

As described above, in the case where a strong harmonic signal is generated (i.e., when the method of FIG. 2 can be employed), harmonics can be evaluated by simply performing spectral analysis after phase adjustment. However, when a signal which is only slightly stronger than noise (i.e., the method of FIG. 5 must be employed), it is necessary to check the presence of each harmonic signal in advance and to extract specific signals to be analyzed, while separating them from noise signals. The thus-extracted signals are subjected to spectral analysis, whereby the accuracy of analysis can be improved remarkably. As described above, even in the case where a very weak magnetic signal is detected, the frequency range can be expanded to be greater than 20 kHz, which is greater than the conventional frequency range of 1.5 kHz (a reliable range is 1 kHz), and the operation can be extended to analysis of higher-order harmonics, because of use of an A/D converter (for audio use) and elimination of noise signals through multi-stage fundamental-wave extraction.

For example, there is assumed a case where two waves of the same frequency having a phase difference of 90 degrees therebetween are present and the ratio of their rms values is 100:1. Such waves which are identical in frequency but greatly differ in magnitude are very difficult to separate and extract through the fundamental-wave extraction operation. Therefore, when the fundamental-wave extraction is employed for the weak-signal detection operation, the imaginary component, which is typically one hundredth of the real component, must be ignored. However, waves which differ in frequency can be separated and extracted quite accurately through fundamental-wave extraction, even when their rms values differ greatly. Therefore, the real parts of higher-order harmonic components can be detected. In this case, since the imaginary component of AC magnetic susceptibility is ignored, the phase adjustment is performed in such a manner that the signal of the real part can be detected accurately. That is, phase adjustment is performed in such a manner that the fundamental wave component of interest and the reference voltage signal having the same frequency as the fundamental wave component have the same phase (in the case of a higher-order harmonic, a virtual reference signal must be created in the program).

The signal having undergone phase adjustment is multiplied with the reference voltage signal, and the resultant signal is subjected to Fourier transformation processing. This method is effective for cases where the extraction frequency of a waveform of interest is previously known. Here, the reference voltage signal "reference" is assumed to be a sinusoidal signal having a frequency $f_{ref}$ Hz, and the detection signal "signal" is assumed to have a frequency f, Hz. The output V generated as a result of multiplication of these two signals is represented by the following Equation (3).

$$\text{signal} = \sin(2 \times \pi \times f_s \times t) = \sin\omega_s t \quad (1)$$

$$\text{reference} = \sin(2 \times \pi \times f_{ref} \times t) = \sin\omega_{ref} t \quad (2)$$

$$V = \sin\omega_s t \times \sin\omega_{ref} t = \frac{\cos(\omega_s - \omega_{ref})t - \cos(\omega_s + \omega_{ref})t}{2} \quad (3)$$

That is, Equation (3) shows that the output V includes a component corresponding to the difference between the two frequencies, and a component corresponding to the sum of the two frequencies. When the frequencies of the two signals are the same, the output V includes a DC component (period: 0), and a component whose frequency is two times the frequency $f (=f_{ref}=f_s)$.

$$V = \frac{1}{2}\{1 - \cos(\omega_s + \omega_{ref})t\} \quad (4)$$

The DC component of Equation (4), which represents the product between the rms value of the reference voltage signal and that of the detection signal, is taken out. In the case of an ordinary lock-in amplifier, this DC component is taken out by use of a low-pass filter having a certain frequency band width. In contrast, in the present invention, the waveform of a signal obtained through the multiplication is subjected to fast Fourier transformation (FFT) processing, whereby the DC component is accurately extracted. In the course of this FFT processing, an operator can readily determine, by checking power spectra, whether or not the phase adjustment has been optimally performed. That is, if a spectral signal greater than the noise level is present in addition to the DC component and the frequency component of 2f, there is room for modifying the phase adjustment (as is empirically known, when the phase adjustment is improper, in many cases the frequency component of 1f may appear).

The above operation is executed for all the fundamental waves. In general, the fundamental-wave extraction is performed up to the fourth stage. Each harmonic component extracted by means of FFT such that its DC component is accurately separated from the noise component is then processed in the same manner as having been described in relation to FIG. 2. That is, for each harmonic component, the rms value of the detection signal is obtained and converted to an absolute value in the emu unit system, and then subjected to statistical processing. Notably, in the system of FIG. 5, the harmonic analysis operation substantially starts from the multi-stage fundamental-wave extraction.

As shown in FIGS. 2 and 5, the results of the statistical processing are displayed on the screen of the personal computer along with information regarding temperature and DC magnetic field. Signal extraction operation is an operation of detecting a signal generated when a magnetic field is swayed at a certain AC frequency, and extracting the signal while separating it from noise. By making use of such a signal extraction technique, it becomes possible to eliminate magnetic field variation caused by the geomagnetism in a superconducting magnet. Thus, we succeeded that accuracy can be increased to 100 to 1000 times that of the conventional system, which has an accuracy of $10^{-7}$ emu in the AC mode ($10^{-8}$ emu in the DC mode).

The above-described signal processing enables an observer to proceed with the analysis while checking actual experimental results in real time in each of the stages of signal acquisition, harmonic extraction, phase adjustment, spectral analysis, and statistical processing, without leaving the analysis to the apparatus. Thus, the performance of the apparatus can be drawn out to the maximum extent. According to the present invention, measurement accuracy can be improved, and in addition, the frequency range can be increased, whereby variety of magnetic measurements can be realized. Since an improved signal analysis technique is established as described above, highly accurate magnetic measurement in a state where the magnetic shield is poor becomes possible, and the degree of freedom in designing the coil system is increased. In addition, it becomes possible to apply the magnetic characteristic measurement apparatus to measurement with a high pressure generation device. Moreover, since the latest A/D converter can be used, further improvement in accuracy is expected, through future improvement in the quality of the product (A/D converter).

In the conventional method, the signal extraction operation is a black box. Therefore, an indeterminate phenomenon, such as phase shift, caused by AC loss stemming from eddy current, cannot be inspected, and detection of a magnetic signal whose intensity is similar to noise must be abandoned. In contrast, the method of the present invention allows an operator to perform the analysis work while checking the AC waveform of an actual magnetic signal with his own eyes. Further, noise can be greatly reduced through statistical processing (i.e., median calculation).

In the conventional magnetic characteristic measurement apparatus, the process of phase detection is placed in a black box, and the apparatus appears convenient. However, this closed configuration becomes a great barrier against improvement in accuracy. According to the present invention, the A/D converter can be replaced with the newest model at any time, and the phase detection operation in the open form greatly increases the possibility of detection of a very weak magnetic signal. This enables provision of a system having a configuration suited for the user's demands and budget. For example, it is possible to provide a standard phase detection system for users who do not require high accuracy, and to provide a precise phase detection system utilizing multi-stage processing when quite high accuracy is required. Examples of systems that can be provided include the SQUID signal processing technique adapted to a conventional prevailing apparatus, and a set including the magnetic characteristic measurement apparatus and a simple refrigerator.

EXAMPLE

Figure 6C:
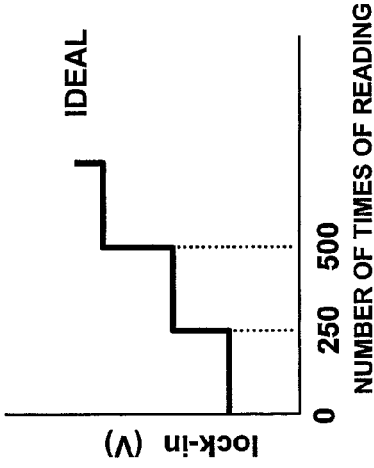
FIGS. 6A to 6D are graphs used for comparing the performance of a conventional lock-in amplifier used for input of a detection signal to a personal computer and the performance of an A/D converter used in the present invention.
Figure 6D:
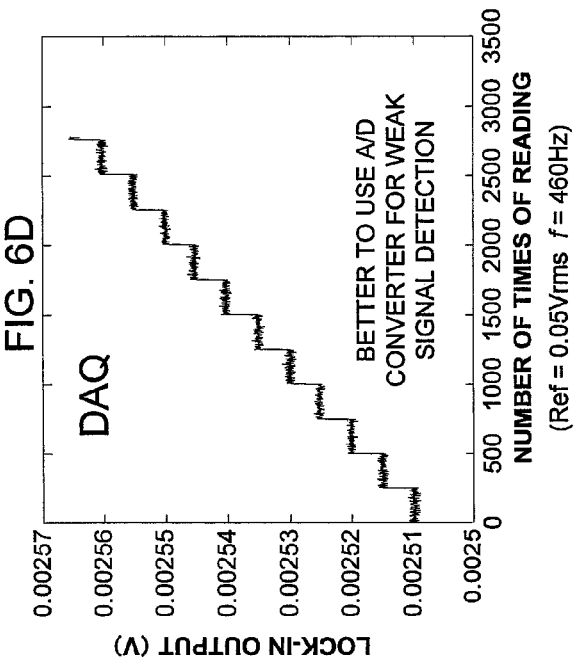
Figure 6A:
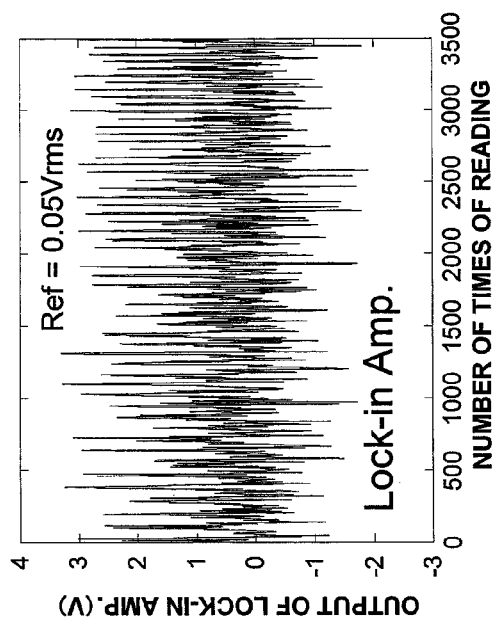
Figure 6B:
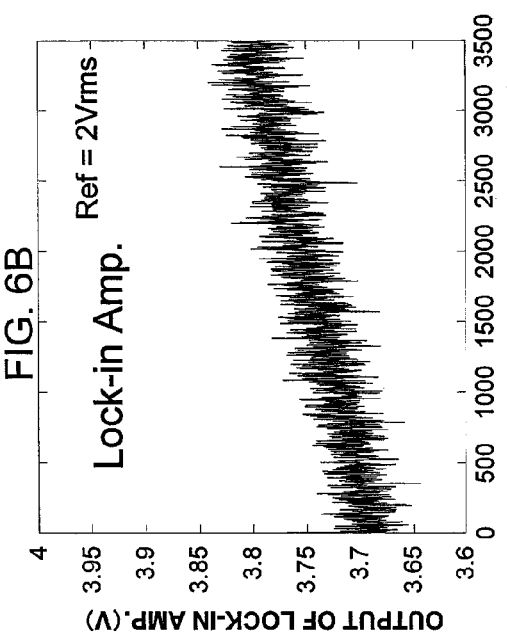

FIGS. 6A to 6D are graphs used for comparing the performance of a conventional lock-in amplifier used for input of a detection signal to a personal computer and the performance of an A/D converter used in the present invention. The graph of FIG. 6A shows the output of the lock-in amplifier when a reference voltage signal of 0.05 Vrms is input to the lock-in amplifier. The graph of FIG. 6B shows the output of the lock-in amplifier when a reference voltage signal of 2 Vrms is input thereto. The graphs of FIGS. 6A and 6B show the output obtained through an experiment and amplified by a factor of 25. FIG. 6C shows an ideal lock-in output. Specifically, FIG. 6C shows ideal changes in the case where the amplitude of the AC signal is increased by 0.0001 Vrms whenever the reading operation is performed 250 times. The graphs of FIG. 6D shows the output (lock-in output) of the A/D converter for DAQ (data acquisition) to which a reference voltage signal of 0.05 Vrms is input. In the analysis of FIG. 6D, after the reference voltage signal and the detection signal are multiplied together (see FIG. 5), fast Fourier transformation is performed so as to extract the DC component.

In each of the graphs, the vertical axis represents the lock-in output after phase detection (the product between the rms value of the reference voltage signal and that of the detection signal), and the horizontal axis represents the number of times of reading. As described above, the reference voltage signal is increased by $1 \times 10^{-4}$ Vrms every time the reading operation (acquisition) is performed 250 times. In the case where a lock-in amplifier is used, the signal is too weak to detect, irrespective of whether the reference voltage signal is 2 Vrms or 0.05 Vrms. In contrast, use of an A/D converter enables detection of a signal even when the reference voltage signal is as low as 0.05 Vrms.

An A/D converter for audio use is desirably used for the above-described A/D converter. An A/D converter for audio use refers to an A/D converter which is effective in the audio frequency range (20 Hz to 20 kHz). Further, the above-described A/D converter is desirably an oversampling-type A/D converter for audio use. Oversampling refers to an operation of sampling a signal at a frequency which is, for example, 128 times the sampling frequency, and downsampling is performed after the oversampling, whereby noise resistance is enhanced. In the oversampling-type A/D converter, an analog input is passed through an analog filter, and is then subjected to AD conversion in which oversampling is performed. A resultant output is passed through a digital filter, and the output of the digital filter is used. When the output of the A/D converter is fed to a computer, the computer can provide a digital filter by means of computer processing. Therefore, a digital filter in the form of hardware becomes unnecessary.

What is claimed is:

1. A method for measuring magnetic characteristics of a sample by use of a superconducting quantum interference device which detects a magnetization of the sample located in the vicinity of a superconducting pickup coil and outputs an electrical signal representing the magnetization, and a coil connected to an AC power supply so as to generate an alternating magnetic field around the superconducting pickup coil, the method comprising the steps of:
    sampling an AC signal output from the superconducting quantum interference device by use of an A/D converter which is operable in an audio frequency range and outputs a digital signal corresponding to the AC signal;
    performing phase adjustment so as to optimally correct a time shift of the digital signal in relation to a reference voltage signal;
    subjecting the phase-adjusted signal to Fourier transformation processing so as to detect harmonic components as magnetic characteristics; and
    performing harmonic analysis so as to individually extract the rms value of each harmonic component calculated by the Fourier transformation and convert the same to an absolute value.

2. A method according to claim 1, further comprising the steps of performing measurement a plurality of times under the same conditions such that a plurality of rms values of each extracted harmonic component are obtained, and calculating the median of the rms values through statistical processing.

3. A method according to claim 1, wherein the A/D converter is a digital signal recorder in which after filtering by use of an analog filter, oversampling A/D conversion is performed, and then filtering is performed by use of a digital filter so as to eliminate quantization noise, the digital signal recorder sampling a signal at a sampling rate of at least 40 kHz in an audio frequency range of 20 Hz to 20 kHz, and quantizing the value of the signal to a digital value of at least 16 bits.

4. A method for measuring magnetic characteristics of a sample by use of a superconducting quantum interference device which detects a magnetization of the sample located in the vicinity of a superconducting pickup coil and outputs an electrical signal representing the magnetization, and a coil connected to an AC power supply so as to generate an alternating magnetic field around the superconducting pickup coil, the method comprising the steps of:
    sampling an AC signal output from the superconducting quantum interference device by use of an A/D converter which is operable in an audio frequency range and outputs a digital signal corresponding to the AC signal;
    performing fundamental-wave extraction processing for the digital signal output from the A/D converter in a plurality of stages so as to successively extract each of the harmonic components as a fundamental wave signal;
    adjusting the phase of the fundamental wave signal such that the fundamental wave signal has the same phase as a corresponding reference signal having the same frequency as the fundamental wave signal;
    multiplying the phase-adjusted fundamental wave signal by the corresponding reference signal and extracting a component representing the product between the phase-adjusted fundamental wave signal and the corresponding reference signal; and
    subjecting the extracted component to Fourier transformation processing so as to extract the corresponding harmonic component as magnetic characteristics, while separating the harmonic component from a noise component.

5. A method according to claim 4, further comprising the step of performing harmonic analysis so as to individually extract the rms value of each harmonic component calculated by the Fourier transformation and convert the same to an absolute value.

6. A method according to claim 5, further comprising the steps of performing measurement a plurality of times under the same conditions so as to obtain a plurality of rms values of each extracted harmonic component, and calculating the median of the rms values through statistical processing.

7. A method according to claim 4, wherein the A/D converter is a digital signal recorder in which after filtering by use of an analog filter, oversampling A/D conversion is performed, and then filtering is performed by use of a digital filter so as to eliminate quantization noise, the digital signal recorder sampling a signal at a sampling rate of at least 40 kHz in an audio frequency range of 20 Hz to 20 kHz, and quantizing the value of the signal to a digital value of at least 16 bits.

8. A system for measuring magnetic characteristics of a sample by use of a superconducting quantum interference device which detects a magnetization of the sample located in the vicinity of a superconducting pickup coil and outputs an electrical signal representing the magnetization, and a coil connected to an AC power supply so as to generate an alternating magnetic field around the superconducting pickup coil, the system comprising:

means for sampling an AC signal output from the superconducting quantum interference device by use of an A/D converter which is operable in an audio frequency range and outputs a digital signal corresponding to the AC signal;

means for performing phase adjustment so as to optimally correct a time shift of the digital signal in relation to a reference voltage signal;

means for subjecting the phase-adjusted signal to Fourier transformation processing so as to detect harmonic components as magnetic characteristics; and means for performing harmonic analysis so as to individually extract the rms value of each harmonic component calculated by the Fourier transformation and convert the same to an absolute value.

9. A system for measuring magnetic characteristics of a sample by use of a superconducting quantum interference device which detects a magnetization of the sample located in the vicinity of a superconducting pickup coil and outputs an electrical signal representing the magnetization, and a coil connected to an AC power supply so as to generate an alternating magnetic field around the superconducting pickup coil, the system comprising:

means for sampling an AC signal output from the superconducting quantum interference device by use of an A/D converter which is operable in an audio frequency range and outputs a digital signal corresponding to the AC signal;

means for performing fundamental-wave extraction processing for the digital signal output from the A/D converter in a plurality of stages so as to successively extract each of the harmonic components as a fundamental wave signal;

means for adjusting the phase of the fundamental wave signal such that the fundamental wave signal has the same phase as a corresponding reference signal having the same frequency as the fundamental wave signal;

means for multiplying the phase-adjusted fundamental wave signal by the corresponding reference signal and extracting a component representing the product between the phase-adjusted fundamental wave signal and the corresponding reference signal; and means for subjecting the extracted component to Fourier transformation processing so as to extract the corresponding harmonic component as magnetic characteristics, while separating the harmonic component from a noise component.

* * * * *